(12) United States Patent
Andrikowich et al.

(10) Patent No.: US 9,293,169 B2
(45) Date of Patent: Mar. 22, 2016

(54) SEAL-TYPE LABEL TO CONTAIN PRESSURIZED GAS ENVIRONMENT

(71) Applicant: Seagate Technology LLC, Cupertino, CA (US)

(72) Inventors: Thomas G. Andrikowich, Whitinsville, MA (US); Michael C. Strzepa, Shrewsbury, MA (US)

(73) Assignee: Seagate Technology LLC, Scotts Valley, CA (US)

( * ) Notice: Subject to any disclaimer, the term of this patent is extended or adjusted under 35 U.S.C. 154(b) by 229 days.

(21) Appl. No.: 13/866,878

(22) Filed: Apr. 19, 2013

(65) Prior Publication Data

US 2013/0235488 A1 Sep. 12, 2013

Related U.S. Application Data

(63) Continuation of application No. 10/839,685, filed on May 4, 2004, now abandoned.

(51) Int. Cl.
*G11B 33/14* (2006.01)
*H05K 5/06* (2006.01)
*G11B 25/04* (2006.01)

(52) U.S. Cl.
CPC .......... *G11B 33/1486* (2013.01); *G11B 25/043* (2013.01); *G11B 33/1466* (2013.01); *H05K 5/06* (2013.01)

(58) Field of Classification Search
USPC ............. 360/99.17, 99.18, 99.2, 99.21, 99.22
See application file for complete search history.

(56) References Cited

U.S. PATENT DOCUMENTS

| | | |
|---|---|---|
| 1,369,919 A | 3/1921 | Eliel |
| 2,060,498 A | 11/1936 | Gobb |
| 3,047,703 A | 7/1962 | Aske |
| 3,077,638 A | 2/1963 | Hickam |
| 4,110,506 A | 8/1978 | Cottingham |
| 4,367,503 A | 1/1983 | Treseder |
| 4,488,192 A | 12/1984 | Treseder |
| 4,556,969 A | 12/1985 | Treseder et al. |
| 4,560,428 A | 12/1985 | Sherrick |
| 4,665,309 A | 5/1987 | Derbyshire |

(Continued)

FOREIGN PATENT DOCUMENTS

| | | |
|---|---|---|
| EP | 58811 A1 | 9/1982 |
| JP | 60045990 A | 3/1985 |

(Continued)

OTHER PUBLICATIONS

IBM Corp., "Seal for a Hermetically Sealed Disk Dile," IBM Technical Disclosure Bulletin, Apr. 1985, vol. 27, No. 11.

(Continued)

*Primary Examiner* — Brian Miller
(74) *Attorney, Agent, or Firm* — Hall Estill Attorneys at Law (57) ABSTRACT

In some embodiments, a data storage device has a housing with a cover and a base to define an interior environment. Fasteners extend through the housing to secure respective shafts that support a rotatable data recording medium and an actuator assembly, respectively. Spaced apart first and second seals contactingly engage and surround the housing to sealingly cover the fasteners. Third and fourth seals contactingly engage the first and second seals and the housing to seal the first and second seals.

20 Claims, 6 Drawing Sheets

(56) References Cited

U.S. PATENT DOCUMENTS

| | | | |
|---|---|---|---|
| 4,771,151 A | 9/1988 | Pursell | |
| 4,825,316 A | 4/1989 | Kishi et al. | |
| 4,980,786 A | 12/1990 | O'Sullivan | |
| 5,097,978 A * | 3/1992 | Eckerd | 220/315 |
| 5,214,549 A * | 5/1993 | Baker et al. | 360/99.19 |
| 5,223,996 A | 6/1993 | Read et al. | |
| 5,270,887 A * | 12/1993 | Edwards et al. | 360/99.16 |
| 5,276,577 A * | 1/1994 | Brooks et al. | 360/99.18 |
| 5,282,100 A * | 1/1994 | Tacklind et al. | 360/99.18 |
| 5,317,462 A | 5/1994 | Kakizaki et al. | |
| 5,421,943 A | 6/1995 | Tam et al. | |
| 5,422,766 A | 6/1995 | Hack et al. | |
| 5,454,157 A | 10/1995 | Ananth et al. | |
| 5,568,341 A * | 10/1996 | Shikano | 360/99.18 |
| 5,600,509 A * | 2/1997 | Kawakami | 360/97.21 |
| 5,601,125 A | 2/1997 | Parsoneault et al. | |
| 5,624,750 A | 4/1997 | Martinez et al. | |
| 5,666,243 A | 9/1997 | Brent | |
| 5,671,103 A | 9/1997 | Tada | |
| 5,696,648 A | 12/1997 | Jeong | |
| 5,732,459 A | 3/1998 | Shiraishi et al. | |
| 5,781,373 A * | 7/1998 | Larson et al. | 360/99.19 |
| 5,784,296 A | 7/1998 | Baker et al. | |
| 5,793,566 A * | 8/1998 | Scura et al. | 360/99.18 |
| 6,031,729 A | 2/2000 | Berkely et al. | |
| 6,058,335 A | 5/2000 | Kim | |
| 6,088,190 A * | 7/2000 | Anderson | 360/99.18 |
| 6,144,178 A | 11/2000 | Hirono et al. | |
| 6,164,837 A | 12/2000 | Haake et al. | |
| 6,178,059 B1 | 1/2001 | Frees | |
| 6,222,375 B1 | 4/2001 | Fitzpatrick et al. | |
| 6,266,207 B1 * | 7/2001 | Iwahara et al. | 360/99.18 |
| 6,303,288 B1 | 10/2001 | Furcht et al. | |
| 6,317,286 B1 | 11/2001 | Murphy | |
| 6,373,654 B1 * | 4/2002 | Iwahara et al. | 360/97.19 |
| 6,392,838 B1 * | 5/2002 | Hearn et al. | 360/99.18 |
| 6,423,938 B1 | 7/2002 | Murari et al. | |
| 6,430,000 B1 | 8/2002 | Rent | |
| 6,436,853 B2 | 8/2002 | Lin et al. | |
| 6,496,362 B2 | 12/2002 | Osterhout et al. | |
| 6,525,899 B2 * | 2/2003 | Hearn et al. | 360/99.21 |
| 6,567,235 B2 | 5/2003 | Kasetty et al. | |
| 6,567,237 B2 * | 5/2003 | Iwahara et al. | 360/99.19 |
| 6,618,221 B2 | 9/2003 | Gillis et al. | |
| 6,631,053 B1 | 10/2003 | Chew | |
| 6,636,378 B2 * | 10/2003 | Tokunaga et al. | 360/99.19 |
| 6,644,362 B2 | 11/2003 | Bernett | |
| 6,646,821 B2 | 11/2003 | Bernett | |
| 6,678,102 B1 | 1/2004 | Liikanen et al. | |
| 6,683,747 B2 | 1/2004 | Bernett | |
| 6,697,213 B2 * | 2/2004 | Lofstrom et al. | 360/99.19 |
| 6,721,128 B1 * | 4/2004 | Koizumi et al. | 360/99.21 |
| 6,762,909 B2 | 7/2004 | Albrecht et al. | |
| 6,785,082 B2 | 8/2004 | Fiorvanti et al. | |
| 6,785,089 B2 | 8/2004 | Bernett et al. | |
| 6,876,515 B2 | 4/2005 | Unno | |
| 6,898,043 B2 | 5/2005 | Fioravanti | |
| 6,903,898 B2 * | 6/2005 | Nonaka et al. | 360/99.19 |
| 6,914,742 B1 | 7/2005 | Fioravanti et al. | |
| 6,930,858 B2 | 8/2005 | Gunderson et al. | |
| 6,970,322 B2 | 11/2005 | Bernett | |
| 6,989,493 B2 | 1/2006 | Hipwell, Jr. et al. | |
| 6,999,262 B2 | 2/2006 | Han et al. | |
| 7,016,145 B2 | 3/2006 | Gunderson et al. | |
| 7,218,473 B2 * | 5/2007 | Bernett et al. | 360/97.22 |
| 7,222,406 B2 | 5/2007 | Chou et al. | |
| 7,359,144 B2 * | 4/2008 | Xu et al. | 360/99.21 |
| 7,362,541 B2 * | 4/2008 | Bernett et al. | 360/99.21 |
| 7,428,122 B2 * | 9/2008 | Kimura et al. | 360/99.21 |
| 7,522,375 B2 * | 4/2009 | Tsuda et al. | 360/99.21 |
| 7,667,926 B2 * | 2/2010 | Naruse | 360/97.19 |
| 7,692,891 B2 * | 4/2010 | Hatchett et al. | 360/99.21 |
| 7,709,078 B1 * | 5/2010 | Sevier et al. | 428/138 |
| 7,929,247 B2 * | 4/2011 | Uefune et al. | 360/97.22 |
| 8,014,167 B2 * | 9/2011 | Gunderson et al. | 361/800 |
| 8,139,316 B2 * | 3/2012 | Tashiro et al. | 360/99.21 |
| 8,358,109 B2 * | 1/2013 | Gunderson | 320/166 |
| 8,530,032 B1 * | 9/2013 | Sevier et al. | 428/138 |
| 8,854,766 B1 * | 10/2014 | Gustafson et al. | 360/97.12 |
| 8,995,119 B2 * | 3/2015 | Thijssen et al. | 361/679.33 |
| 2002/0029461 A1 | 3/2002 | Kamigama et al. | |
| 2002/0040518 A1 | 4/2002 | Butts et al. | |
| 2002/0044376 A1 | 4/2002 | Serizawa | |
| 2002/0089782 A1 | 7/2002 | Hearn | |
| 2002/0114104 A1 | 8/2002 | Hearn | |
| 2002/0153672 A1 | 10/2002 | Caplain | |
| 2003/0007280 A1 | 1/2003 | Bernett et al. | |
| 2003/0026033 A1 | 2/2003 | Fioravanti et al. | |
| 2003/0081349 A1 | 5/2003 | Bernett | |
| 2003/0089417 A1 | 5/2003 | Bernett | |
| 2003/0090832 A1 | 5/2003 | Bernett et al. | |
| 2003/0172520 A1 | 9/2003 | Liu et al. | |
| 2003/0179489 A1 | 9/2003 | Bernett et al. | |
| 2003/0202276 A1 | 10/2003 | Smith | |
| 2003/0214748 A1 | 11/2003 | Fioravanti | |
| 2003/0223148 A1 | 12/2003 | Macleod et al. | |
| 2004/0216514 A1 | 11/2004 | Nunnally et al. | |
| 2005/0068666 A1 | 3/2005 | Albrecht et al. | |
| 2005/0173870 A1 | 8/2005 | Gunderson | |
| 2005/0184463 A1 | 8/2005 | Boutaghou et al. | |
| 2006/0002067 A1 | 1/2006 | Gunderson et al. | |
| 2006/0044666 A1 | 3/2006 | Fukushima | |
| 2006/0044675 A1 | 3/2006 | Fukushima et al. | |
| 2006/0072241 A1 | 4/2006 | Feliss et al. | |
| 2006/0072244 A1 | 4/2006 | Rapp | |
| 2007/0263319 A1 * | 11/2007 | Calderon et al. | 360/97.02 |
| 2010/0232064 A1 * | 9/2010 | Lim et al. | 360/129 |

FOREIGN PATENT DOCUMENTS

| | | | |
|---|---|---|---|
| JP | 61115290 A | 6/1986 | |
| JP | 61115291 A | 6/1986 | |
| JP | 61292289 A | 12/1986 | |
| JP | 62071078 A | 4/1987 | |
| JP | 62175986 A | 8/1987 | |
| JP | 62175988 A | 8/1987 | |
| JP | 62279591 A | 12/1987 | |
| JP | 63137205 A | 6/1988 | |
| JP | 05062446 A | 3/1993 | |
| JP | 08161881 A | 6/1996 | |
| JP | 2001307458 A | 11/2001 | |
| WO | 2004010419 A1 | 1/2004 | |
| WO | 2004010431 A1 | 1/2004 | |

OTHER PUBLICATIONS

English-language translation of JP (62-071078A).
IBM Corp., "Disk File with Reduced or Eliminated Air Effects," IBM TDB, Feb. 1, 1981, pp. 4310-4311, vol. 23, No. 9.
U.S. Appl. No. 10/055,237, filed Oct. 24, 2001, Marshall, et al.
U.S. Appl. No. 10/266,436, filed Oct. 8, 2002, Andrikowich.
U.S. Appl. No. 10/839,608, filed May 4, 2004, deJesus, et al.
U.S. Appl. No. 10/848,476, filed May 17, 2004, Burns, et al.
U.S. Appl. No. 10/839,611, filed May 4, 2004, Gifford, et al.
U.S. Appl. No. 10/839,548, filed May 4, 2004, Andrikowich, et al.
U.S. Appl. No. 10/839,606, filed May 4, 2004, Andrikowich, et al.
U.S. Appl. No. 10/860,626, filed Jun. 2, 204, Mann, et al.

* cited by examiner

SEAL-TYPE LABEL TO CONTAIN PRESSURIZED GAS ENVIRONMENT

RELATED APPLICATION

This application is a continuation of copending U.S. patent application Ser. No. 10/839,685 filed May 4, 2004.

FIELD OF THE INVENTION

The present invention relates to low density gas-filled hard disk drives and, more particularly, to seals to contain a pressurized gas environment on a temporary and permanent basis.

BACKGROUND OF THE INVENTION

Hard disk drives incorporate magnetic storage disks and read/write heads which are capable of reading data from and writing data onto the rotating storage disks. Data is typically stored on each magnetic storage disk in a number of concentric tracks on the disk. The read/write heads, also referred to as read/write transducers or read/write elements, are integrated within a slider. The slider, in turn, is part of an actuator assembly which positions the heads relative to the surface of the storage disks. This may be at a predetermined height above the corresponding storage disk or, in some instances, in contact with the surface of the storage disk. The actuator assembly is typically positioned by a voice coil motor which acts to position the slider over a desired track. One or more read/write heads may be integrated within a single slider. In the case of non-contact sliders, a cushion of air is generated between the slider and the rotating disk. The cushion is often referred to as an air bearing.

Hard disk drives are an efficient and cost effective solution for data storage. Depending upon the requirements of the particular application, a disk drive may include anywhere from one to a plurality of hard disks and data may be stored on one or both surfaces of each disk. While hard disk drives are traditionally thought of as a component of a personal computer or as a network server, usage has expanded to include other storage applications such as set top boxes for recording and time shifting of television programs, personal digital assistants, cameras, music players and other consumer electronic devices, each having differing information storage capacity requirements.

A primary goal of disk drive assemblies is to provide maximum recording density on the storage disk. In order to provide greater storage capacity on a storage disk, track widths have become increasingly narrower. However, decreasing the width of tracks makes it more difficult for the read/write heads to accurately read and write information to and from the narrowing tracks. Not only is it difficult to physically position the read/write element over a narrow width track, but it is increasingly difficult to maintain the read/write element over the track at an optimal position for accurate data transfer. Air turbulence created by the spinning disks, disk flutter and spindle vibrations, temperature and altitude can all adversely effect registration of the read/write element relative to the tracks. Moreover, increasing the speed of the rotating disks to achieve increased data access times increases air turbulence, which increases misregistration between the read/write element and the tracks on the storage disks (track misregistration or TMR). Higher rotational speeds can also increase disk flutter and spindle vibrations further increasing TMR. Higher rotational speeds can also increase spindle motor power and idle acoustics.

Accuracy can be further adversely effected if the read/write heads are not maintained within an optimum height range above the surface of the storage disk. Thus, a related goal is to increase reading efficiency or to reduce reading errors, while increasing recording density. Reducing the distance between the magnetic transducer and the recording medium of the disk generally advances both of those goals. Indeed, from a recording standpoint, the slider is ideally maintained in direct contact with the recording medium (the disk) to position the magnetic transducer as close to the magnetized portion of the disk as possible. Contact positioning of the slider permits tracks to be written more narrowly and reduces errors when writing data to the tracks. However, since the disk rotates many thousands of revolutions per minute or more, continuous direct contact between the slider and the recording medium can cause unacceptable wear on these components. Excessive wear on the recording medium can result in the loss of data, among other things. Excessive wear on the slider can result in contact between the read/write transducer and the disk surface resulting, in turn, in failure of the transducer, which can cause catastrophic failure.

Similarly, the efficiency of reading data from a disk increases as the read element is moved closer to the disk. Because the signal to noise ratio increases with decreasing distance between the magnetic transducer and the disk, moving the read/write element closer to the disk increases reading efficiency. As previously mentioned, the ideal solution would be to place the slider in contact with the disk surface, but there are attendant disadvantages. In non-contact disk drives there are also limitations on how close a read/write element may be to the surface of a disk. A range of spacing is required for several reasons, including the manufacturing tolerances of the components, texturing of the disk surface and environmental conditions, such as altitude and temperature. These factors, as well as air turbulence, disk flutter and spindle vibration, can cause the read/write element flying height to vary or even cause the read/write element to contact the spinning disk.

Disk drives are assembled in a clean room to reduce contamination from entering the drive prior to final assembly. Thus, the air that is trapped within the drive once it is finally sealed is filtered room air. Accordingly, seals or gaskets used in disk drives between the housing components, such as between the base plate and cover, are designed to prevent contaminants from entering the drive. Such seals are not designed to prevent internal air and other gases from exiting through the seal and out of the drive. Loss of gas in this manner is anticipated and accommodated by use of a filtered port to maintain equalized air pressure within the drive compared to that of air pressure outside of the drive.

As an alternative to air-filled drives, advantages may be achieved by filling disk drives with gases having a lower density than air. For example, helium has a lower density than air at similar pressures and temperatures and can enhance drive performance. As used herein, a low density gas or a lower density gas means a gas having a density less than that of air. When compared with air, lower density gases can reduce aerodynamic drag experienced by spinning disks within the drive, thereby reducing power requirements for the spindle motor. A low density gas-filled drive thus uses less power than a comparable disk drive that operates in an air environment. Relatedly, the reduction in drag forces within the low density gas-filled drive reduces the amount of aerodynamic turbulence that is experienced by drive components such as the actuator arms, suspensions and read/write heads. Some low density gases also have greater thermal conductivity, which results in better motor efficiencies and therefore lower power consumption for a given performance level.

Reduction in turbulence allows drives filled with low density gas to operate at higher speeds compared with air-filled drives, while maintaining the same flying height and thereby maintaining the same range of read/write errors. Low density gas-filled drives also allow for higher storage capacities through higher recording densities due to the fact that there is less turbulence within the drive which allows the tracks to be spaced more closely together.

Despite these advantages, low density gas-filled drives have not been commercially successful. Low density gas-filled drives, in order to function, must be effectively sealed over an acceptable lifetime of the drive. It has been difficult to prevent the low density gas from escaping from the sealed drive environment. Unlike air-filled drives, a port may not be used to equalize pressure outside and inside the drive. As a result, the seal between the cover and base plate must minimize or prevent leakage and maintain a threshold level of low density gas within the sealed environment over the expected lifetime of the drive. Conventional rubber seals used in air-filled drives are inadequate at preventing leakage of low density gas due to the smaller atom size of low density gases, such as helium, compared to air. The smaller helium atoms diffuse through the rubber seals, thereby reducing the volume of low density gas within the drive. Thus, over time, the necessary threshold quantity of low density gas may be lost within the drive environment and may or may not be replaced with ambient air. In either case, the performance of the drive will change from the design specifications, namely, a low density gas-filled sealed environment. As the low density gas leaks out of a drive and is replaced by air, the drive is subject to undesirable operational effects possibly leading to unacceptable error rates and/or failure of the drive. For example, the increased concentration of air may increase the turbulent forces on the heads due to the increased drag forces within the drive which may further cause the heads to fly at too great a distance above the disks and potentially increasing instances of read/write errors. If the low density gas leaks from the sealed environment over time and is not replaced by ambient air, problems will occur such as the heads flying at a distance too close or in contact with the disks, thereby increasing instances of read/write errors as well as damage to the disk surface and head and higher operating temperatures due to a reduction in conduction cooling. Each creates a reliability risk. The risk of unanticipated failures due to inadequate amounts of low density gas within the drive is a draw back to low density gas-filled drives. Indeed, data stored within the drive may be irretrievably lost if the drive fails due to the loss of the low density gas environment.

Low density gas-filled drives also must be designed to permit testing and rework, if necessary. Thus, the ability to seal openings in the base plate and/or cover plate on a temporary basis and on a long-term basis must exist. Such openings include, but are not limited to, openings for securing ends of the spindle and actuator shafts to the cover or base plate, or openings to permit self servo-writing. These openings must be adequately sealed to permit testing of the drive under normal conditions and, if possible, unsealed to permit rework. Thus, it is desirable to minimize waste and optimize efficiencies when sealing a disk drive housing to allow rework when needed. It is also desirable to seal openings through which electrical connections are made between components inside and outside the disk drive housing. One example of such a sealing system is disclosed in application Ser. No. 10/839,606 entitled "Method for Controlled Fabrication of Hermetically Sealed PCB Connector", now U.S. Pat. No. 8,059,364, which is incorporated herein in its entirety

SUMMARY OF THE INVENTION

One embodiment of the invention comprises a pair of adhesive seals which, in combination, overlap to form an effective gas-tight seal over openings in disk drive housings. The innermost seal typically acts as a temporary or preliminary seal to maintain sufficient levels of low density gas within the housing of a disk drive following assembly and during testing of the disk drive. This temporary seal is designed to be removed for rework operations, if necessary. Upon successful completion of testing, a second outer seal may be added to create, in combination with the inner seal, an enhanced, long-term seal inhibiting gas migration out of the drive housing. While a single seal may maintain low density gas within the pressurized drive at sufficient levels to meet operation requirements for an acceptable, predetermined lifetime for the disk drive, two overlapping seals in combination can create a more effective seal against loss of low density gas from within the drive. For example, it is believed that the preferred embodiment of the present invention is capable of maintaining a pressurized helium environment within a disk drive for a period of at least five years, losing no more than five percent of the initial volume of low density gas over that time period.

In the preferred embodiment, each of the two seals comprises two layers. The outer layer is a substrate or structural layer which provides integrity and rigidity to the seal. The innermost layer is an adhesive layer for securement of the seal to the disk drive housing. The outer layer may be metal, such as thin aluminum or foil. Alternatively, it may be plastic or metalized plastic. The robustness of the outer layer of the seal will also provide protection against puncture and will assist in creating a hermetic seal. It should be appreciated, however, that the individual seals may comprise more than two layers. For example, a metal layer may be positioned over a plastic layer and adhesive layer to comprise a three-layer seal.

For orientation purposes, the terms "inner" and "outer" as used herein are relative to the interior chamber of the disk drive housing which contains the rotating hard disks and the actuator assembly. Thus, an inner seal is one that is positioned closer to the interior chamber compared to an outer seal, and an inner layer is similarly positioned closer to the interior chamber compared to an outer layer.

The opening in the disk drive to be sealed is preferably counter-bored or multi-layered in order that the outer surface of the outer-most seal is flush with the outer surface of the drive housing. This reduces the likelihood of the seal being unintentionally removed or partially torn away. For the same reasons, the perimeter shape of the seals will also substantially match the perimeter shape of the opening.

In another embodiment, an effective long-term seal is accomplished by adhering or bonding a single two-layer seal over an opening in the disk drive housing. Although this embodiment would typically be used as a temporary or work-in-process seal, it could also be used as a permanent seal depending upon its construction, its intended effective lifetime and its acceptable leakage characteristics over the intended lifetime.

DETAILED DESCRIPTION

Figure 1:
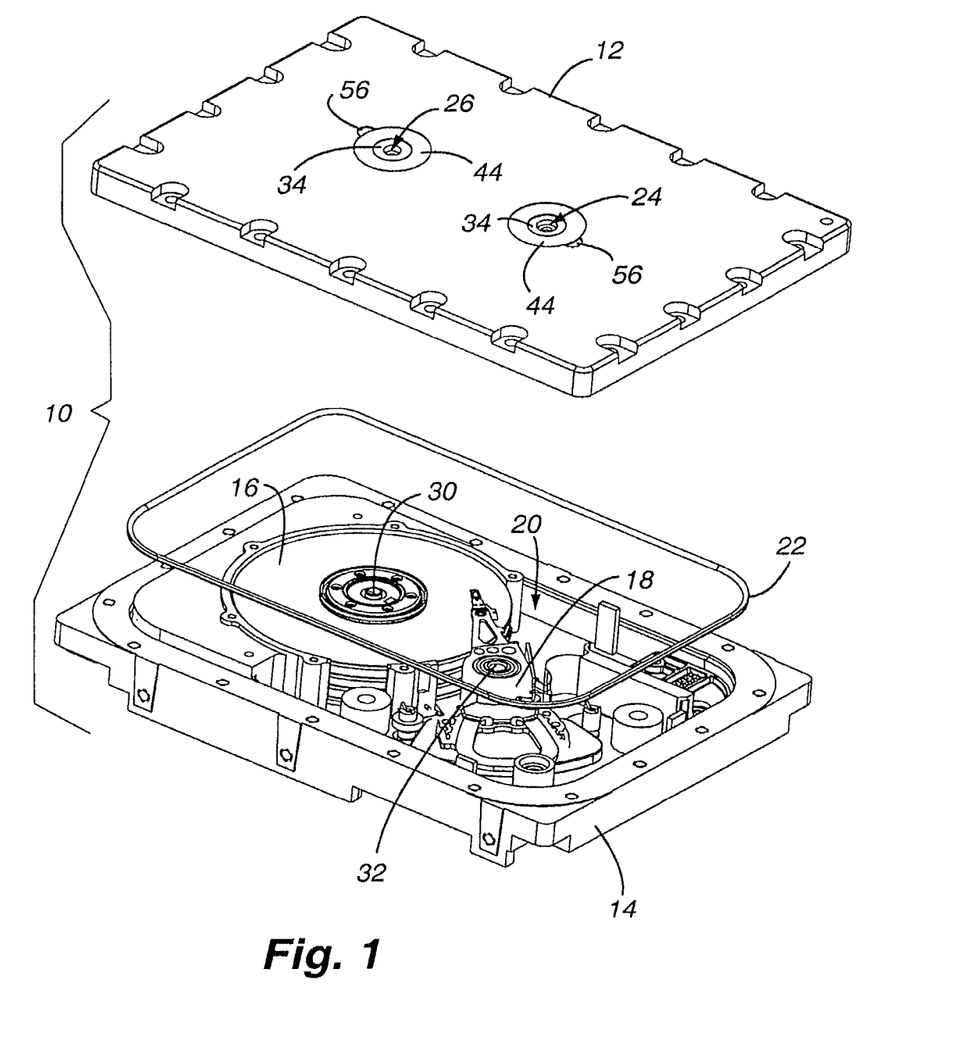
FIG. 1 is an exploded isometric view of a disk drive designed to be filled and sealed with a low density gas.

Turning to FIG. 1, an exploded view of a low density gas disk drive 10 is shown. In general terms, the disk drive comprises a cover 12, base plate 14, plurality of memory disks or disk stack 16 and actuator assembly 18. The disk stack and actuator assembly are positioned in an interior chamber 20 when the cover is attached to the base plate. A perimeter seal 22 is positioned between the cover and base plate to prevent the low density gas within the chamber from escaping between the cover and base plate. As can also be seen in FIG. 1, the cover is provided with two openings 24 and 26 to allow screws 28 to engage the top end of the spindle shaft 30 and actuator shaft 32, respectively, and secure each to the cover.

Figure 2:
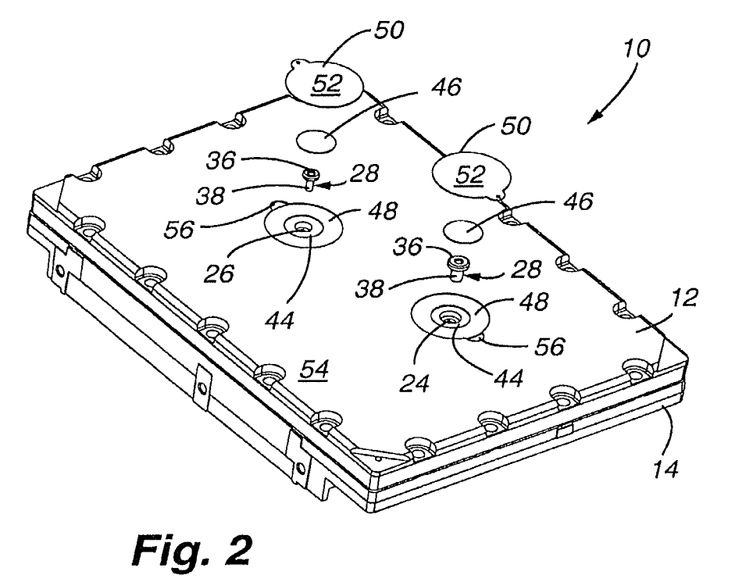
FIG. 2 is an isometric view of the disk drive of FIG. 1, partially assembled, and further showing an exploded view of one embodiment of the present invention.
Figure 3:
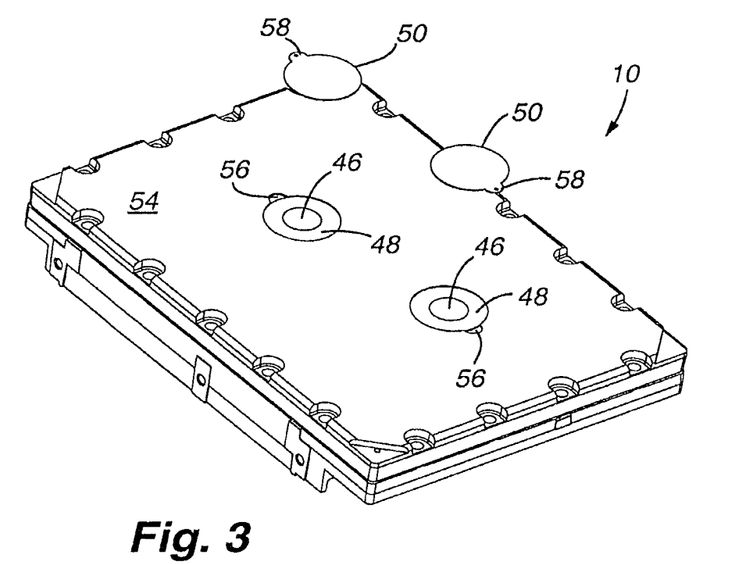
FIG. 3 is an isometric view of the disk drive of FIG. 2, further showing an inner seal in place and an outer seal in an exploded view.
Figure 4:
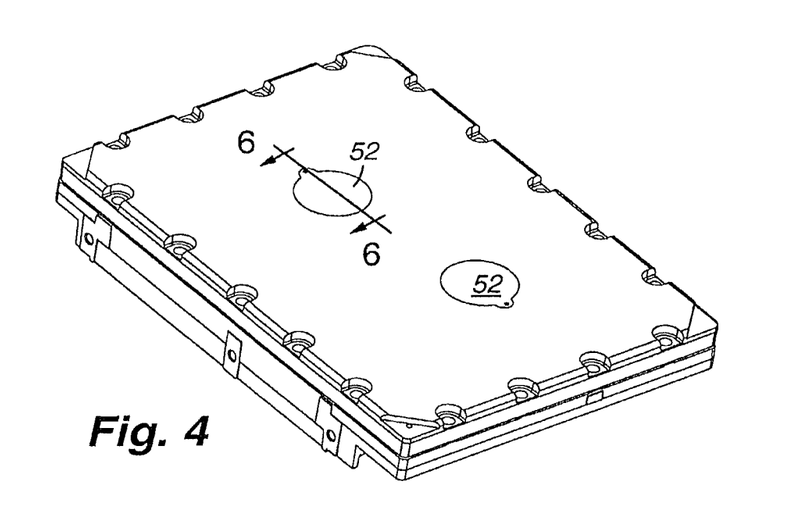
FIG. 4 is an isometric view of the disk drive of FIG. 3, showing the drive fully assembled and outer seals in place over each inner seal.
Figure 6:
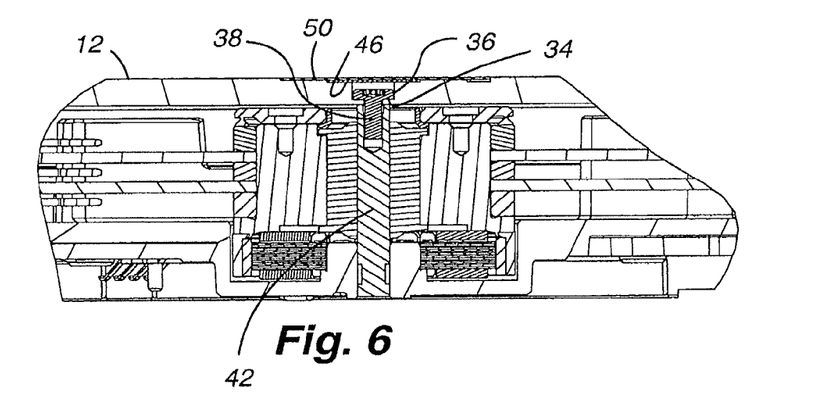
FIG. 6 is a partial cross-section of a low density gas-filled disk drive taken along line 6-6 of FIG. 4.
Figure 7:
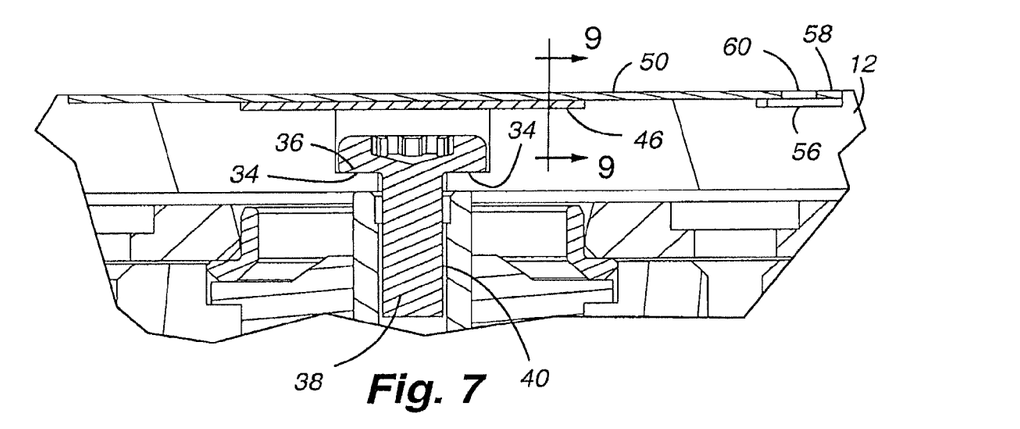
FIG. 7 is an enlargement of the seals shown in FIG. 6.

Turning to FIG. 2, an exploded view of one embodiment of the present invention is shown. As illustrated, the cover 12 is attached to the base plate 14. Two apertures 24, 26 extend completely through the top cover. The apparatus or openings 24, 26 are preferably terraced or multi-leveled. For example, and as also seen in FIGS. 6 and 7, each opening 24, 26 has an inner most surface 34 which receives the head 36 of the fastener to secure the fastener to the cover. The threaded body of the fastener 38 is secured to a complementary threaded portion 40 of the spindle 42. Moving outwardly, the next level or step 44 is designed to receive a first or inner seal 46. The seal is shaped to match the perimeter configuration and depth of the step 44. It is also of a larger diameter than the openings 24 and 26 that receive the fastener 28 in order to fully cover the fastener opening. The outermost level or step 48 is designed to receive a second or outer seal 50. The surface area of the outer seal 50 is larger than the area of the inner seal 46 to completely overlap and cover the inner seal. The outer seal 50 is shaped to match the perimeter configuration and depth of the outer level 48 such that the outer surface 52 of the outer seal is essentially flush with the outer surface 54 of the cover. Optionally, the outermost level 48 may also include an extended portion 56, at the perimeter, for purposes of accommodating a pull tab 58 on the outer seal. Preferably, the extended portion 56 would have a depth greater than that of the outer level 48 to facilitate grasping the tab 58 formed on the outer seal. The tab may also be provided with an aperture 60 to facilitate grasping it. In the preferred embodiment, the tab portion would not have adhesive on its inside surface.

Figure 9:
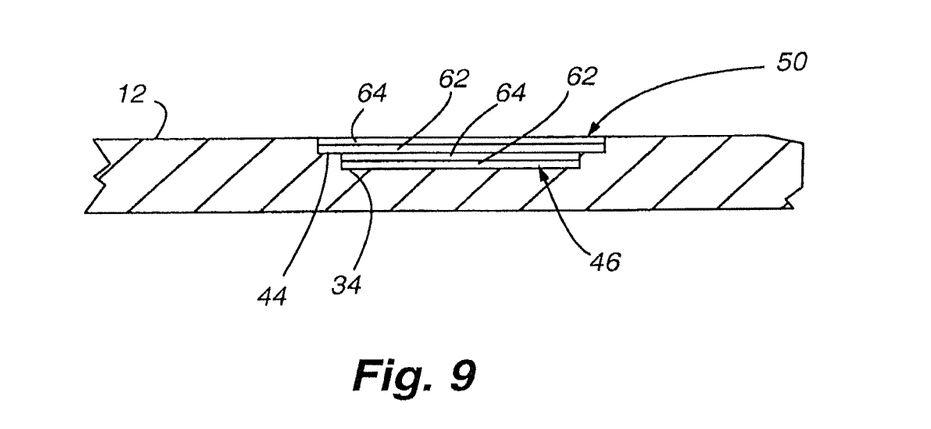
FIG. 9 is a cross-sectional view taken along line 9-9 of FIG. 7.

With reference to FIGS. 4, 6, 7 and 9, a pair of seals are shown in position on an assembled disk drive. FIGS. 6, 7 and 9 show the seal pair enclosing the opening used to secure the spindle shaft to the cover. As shown, fastener 28 is inserted in opening 26. The head 36 of the fastener engages surface 34 in the cover. Next, an inner seal 46 is secured over opening 26. The seal 46 is secured against surface 44 such that it is flush with outer level 48. At a minimum, the inner seal 46 sufficiently seals the opening 26 to allow the interior chamber 20 to be filled with a low density gas, further allowing the assembled disk drive to undergo testing. If the drive fails testing and can be reworked, the inner seal 46 may be removed, allowing access to the fastener and allowing the cover to be removed. If the drive passes testing, in the preferred embodiment, outer seal 50 will be placed in position overlapping inner seal 46, adhering to surface 48. The outer surface 52 of the seal will be flush with the surface 54 of the cover. Pull tab 58 facilitates removal of outer seal 50. If desired, inner seal 46 may also be provided with a pull tab to facilitate its removal.

Turning to FIG. 9, each seal preferably comprises two layers. With reference to the inner seal 46, the inner layer 62 is an adhesive applied to an outer structural layer 64. Because the inner seal may need to be removed for purposes of reworking the drive, the adhesive layer 62 is preferably a pressure sensitive adhesive to more readily permit removal for rework operations. An example of an acceptable pressure sensitive adhesive is acrylic adhesive #553 sold by 3M Company. The structural layer 64 is intended to provide rigidity and integrity to the seal. This layer may be a polyimide plastic, such as Mylar, made by 3M Company, or, more preferably, it may be a metalized plastic by having a thin layer of metal deposited onto the plastic. The metal may be aluminum, an aluminum alloy or any other suitable metal (such as steel). The metal may be applied by deposition, sputtering, or by other techniques known to those of skill in the art. The three-metal layer provides additional rigidity, integrity, helps prevent puncture and inhibits diffusion of gas through the seal.

The outer seal 50 also preferably comprises two layers. The inner layer 62 is preferably a thermoplastic adhesive such as 615 made by 3M Company. A Thermoplastic adhesive offers better adherence to the housing than a pressure sensitive adhesive does. In the preferred embodiment, the permanent seal will have a different adhesive than will the temporary seal. A thermoplastic adhesive requires heating to bond the adhesive layer to the aluminum housing. Heating melts and cures the plastic and creates an adhesive set. Similarly, heat applied to the adhesive seal will allow its removal for rework operations, if necessary. The outer seal may contact and adhere to the inner seal, or an air gap may be formed between the two seals.

Alternatively, a thermoset plastic adhesive may be used. However, the seal could not be reused following rework and it is possible that the housing components may not be reusable either due to the potential inability to completely remove the seal or perhaps, due to damage sustained by the components when attempting to remove the seal.

The outer layer 64 of the seal 50 is preferably limestone-filled epoxy. Limestone makes the epoxy more closely mimic thermal expansion and contraction characteristics of the aluminum housing. The limestone also inhibits helium diffusion through the epoxy. One example of an acceptable epoxy is LCA-4 made by Bacon Industries. Acrylic is preferred because it is cleaner and provides less outgasing than thermoplastics.

In one example, using an outer seal 50, heat is applied locally to a seal having 3M 615 thermoplastic adhesive. The heat is approximately 123° C. This melts the plastic adhesive and establishes a bond between the seal and corresponding surface of the disk drive. This process is sufficient to accommodate heat dissipation through the surrounding aluminum housing. Thermal expansion during the heating process is not a factor. Thermoplastic seals may be prefabricated and maintained in a cold or solid state which would only become active when warmed to room temperature or above.

It should be further appreciated that an inner seal 46 could be used as an outer seal and an outer seal 50 could be used as an inner seal. Similarly, two inner seals could be used as the pair of seals or two outer seals could be used as the pair of inner seals.

Figure 5:
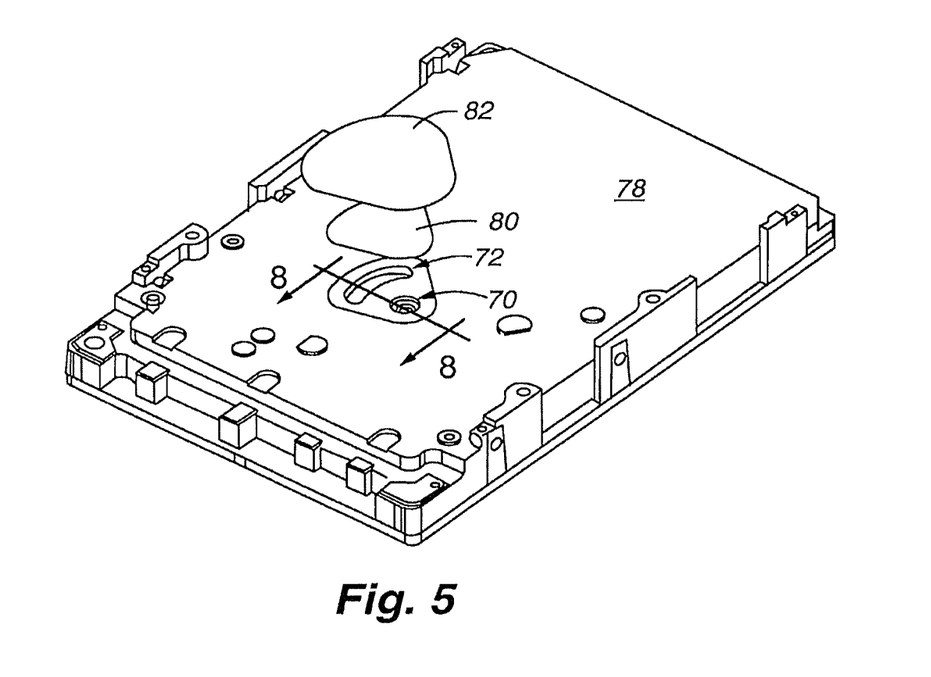
FIG. 5 is an exploded isometric view of the bottom surface of a base plate, showing another embodiment of the present invention.
Figure 8:
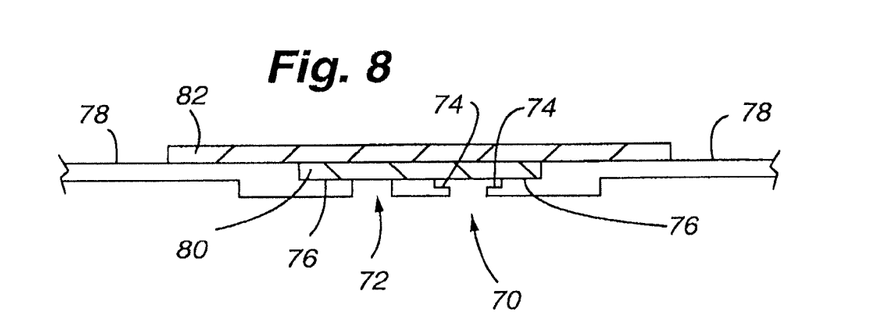
FIG. 8 is a partial cross-section of a base plate taken along line 8-8 of FIG. 5, but further showing the two seals in place on the base plate.

FIGS. 5 and 8 illustrate another embodiment of the present invention. As shown, the sealing system of the present invention may be used for openings in the base plate and for openings other than for fasteners. For example, an aperture 70 may be formed in the base plate to permit a fastener to secure the actuator assembly to the base plate and another opening 72 may be used for servo track writing purposes. Opening 70, like openings 24 and 26, has an inner surface 74 to receive the head of a fastener. A second level 76 is formed outwardly of surface 74. The second level is recessed from the surface 78 of the base plate and encompasses both openings 70 and 72. A first or inner seal 80 is configured to fit within recess 76 and cover both openings 70 and 72. The seal 80 abuts surface 76. A second or outer seal 82 overlaps the first seal and covers an area larger than the first seal. In this embodiment, the outer seal 82 is not recessed relative to the surface 78 of the base plate. It could be recessed to be flush with surface 78 if desired. Similarly, one or both seals could be designed with pull tabs to facilitate removal.

In operation, an initial charge of low density gas, such as helium, is placed in the disk drive after assembly and with the inner or temporary seals 46 and 80 in place. One method for filling a disk drive with low density gas is disclosed in co-pending application Ser. No. 10/266,436 entitled "Method for a Hermetically Sealable Fill Valve", now U.S. Pat. No. 6,831,811, the entirety of which is incorporated herein by reference. Providing an acceptable temporary seal permits the disk drive to be tested as needed. If rework is required, the temporary seal or seals may be removed as necessary to accommodate rework. The temporary seals may then be replaced, allowing the disk drive to be recharged with a low density gas and retested. When the disk drive passes final testing, outer or permanent seals 50 and 82 may be put in place such that the disk may be available for commercial sale and use. However, it is within the scope of this invention that one seal may provide satisfactory sealing or that more than two seals could be used.

Figure 10:
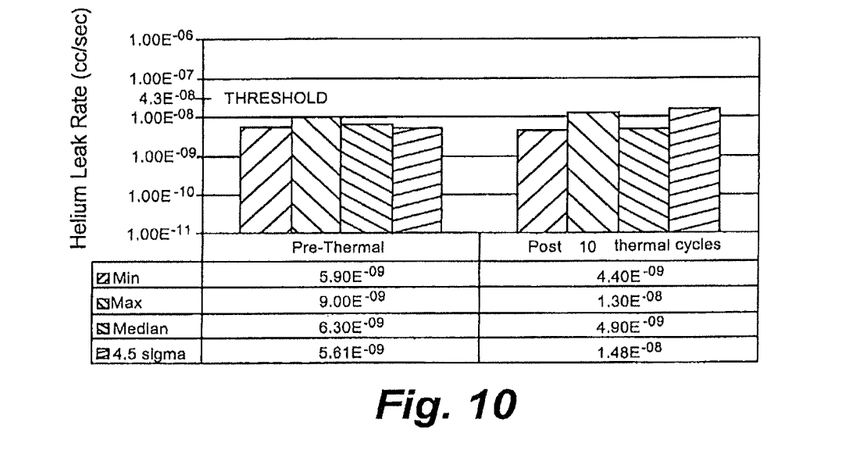
FIG. 10 is a bar graph displaying the results of leak testing performed on a test apparatus having an opening sealed with a single two-layer seal.

FIG. 10 shows data of leak testing performed on a low density gas-filled test apparatus with a single inner seal 46 applied over an opening. The opening covered by the seal did not include a fastener. The seal had a Mylar outer layer 64 and a pressure sensitive adhesive 3M acrylic adhesive #553 inner layer 62. Five test fixtures configured in this matter were tested for leakage after being initially filled with helium. The five test fixtures were then subjected to ten thermal cycles between −40° C. to 100° C. and tested again for leakage. Data was gathered based upon detected helium leakage rate in cubic centimeters per second. The minimum, maximum and median and standard deviation leakage rates for the five test fixtures are: $5.90E^{-9}$ (minimum); $9.00E^{-9}$ (maximum); $6.30E^{-9}$ (median); and $5.61E^{-9}$ standard deviation (4.5 sigma). The minimum leakage rate was $4.40E^{-9}$; the maximum leakage rate was $1.30E^{-8}$; the median leakage rate was $4.90E^{-9}$ and the standard deviation was $1.48E^{-8}$. This test data shows that the temporary seals, alone, restrict leakage below $4.0E_8$ cubic centimeters per second which Applicants believe will limit gas leakage to less than 5% of total volume over a five-year period. Thus, a single inner seal 46 would likely maintain sufficient low density gas within the disk drive to support normal operations for at least a five-year period. Such a seal is substantially hermetic.

Figure 11:
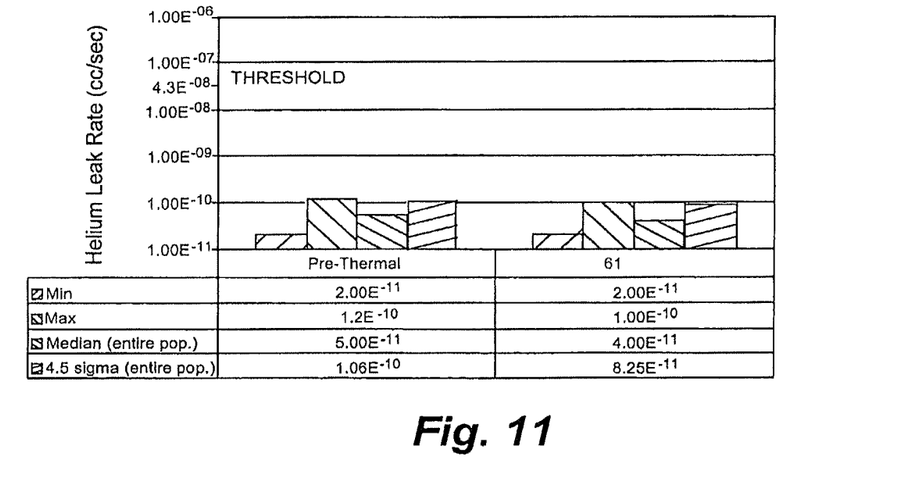
FIG. 11 is a bar graph displaying the results of leak testing performed on a test apparatus having an opening sealed with a different embodiment of a two-layered seal.

FIG. 11 shows helium leak test data for a single outer seal 50 attached to a similar test fixture without an inner seal 46. In these tests a fastener also was not present. The outer layer 68 of the seal was a limestone-filled epoxy. The inner layer 66 was 3M Company 615 thermoplastic. Twenty test fixtures were filled with helium and tested. The minimum leakage rate was $2.00E^{-11}$; the maximum leakage rate was $1.20E^{-10}$; the median leakage rate was $5.00E^{-11}$; and the standard deviation (4.5 sigma) was $1.06E^{-10}$. The same test fixtures were then subjected to a series of 61 thermal cycles between −40° C. to 100° C. Based upon the entire population, the results show a minimum leakage rate of $2.00E^{-11}$; a maximum leakage rate of $1.00E^{-10}$; a median leakage rate of $4.00E^{-11}$; as well as the standard deviation of $1.48E^{-8}$. The data from FIG. 11 shows that the leakage rate for a single outer seal with a limestone filled epoxy outer layer is less than the threshold requirement of 5% over the five-year life of a disk drive. Therefore, combining the two seals tested on a single drive would provide, at worst, no more of a leakage rate and would likely enhance the leakage prevention for the disk drive. Such a combination would provide a substantially hermetic, if not totally hermetic, seal.

The foregoing discussion of the invention has been presented for purposes of illustration and description. The foregoing is not intended to limit the invention to the form or forms disclosed herein. In the foregoing Detailed Description for example, various features of the invention are grouped together in one or more embodiments for the purpose of streamlining the disclosure. This method of disclosure is not to be interpreted as reflecting an intention that the claimed invention requires more features than are expressly recited in each claim. Rather, as the following claims reflect, inventive aspects lie in less than all features of a single foregoing disclosed embodiment. Thus, the following claims are hereby incorporated into this Detailed Description, with each claim standing on its own as a separate preferred embodiment of the invention.

Moreover, though the description of the invention has included description of one or more embodiments and certain variations and modifications, other variations and modifications are within the scope of the invention, e.g. as may be within the skill and knowledge of those in the art, after understanding the present disclosure. It is intended to obtain rights which include alternative embodiments to the extent permitted, including alternate, interchangeable and/or equivalent structures, functions, ranges or steps to those claimed, whether or not such alternate, interchangeable and/or equivalent structures, functions, ranges or steps are disclosed herein, and without intending to publicly dedicate any patentable subject matter.

What is claimed is:

1. A data storage device comprising:
    a housing which defines an interior sealed environment, the housing comprising a base, a cover and a circumferentially extending seal therebetween;
    a first moveable element secured within the housing for rotation about a first shaft member, the first moveable element comprising a rotatable data recording medium;
    a first fastener which extends through a first through hole aperture in a selected one of the cover or the base, the first fastener engaging the first shaft member to secure the first shaft member to the selected one of the cover or the base;

a first seal surrounding and covering the first through hole and a top end of the first fastener opposite the first shaft member;

a second moveable element secured within the housing for rotation about a second shaft member, the second moveable element comprising a data read/write transducer supportable adjacent the data recording medium;

a second fastener which extends through a second through hole aperture in the selected one of the cover or the base, the second fastener engaging the second shaft member to secure the second shaft member to the selected one of the cover or the base;

a second seal nominally identical to the first seal surrounding and covering the first through hole and a top end of the second fastener opposite the second shaft member, the second seal arranged in a non-contacting relation with the first seal so that an intervening gap is provided therebetween;

a third seal which contactingly engages an entirety of a top surface of the first seal and contactingly engages at least a first portion of the selected one of the cover or the base; and a fourth seal which contactingly engages an entirety of a top surface of the second seal and contactingly engages at least a second portion of the selected one of the cover or the base.

2. The data storage device of claim 1, wherein the first fastener and the second fastener are each characterized as a threaded fastener, the first through hole and the second through hole each comprises a threaded sidewall which contactingly engages the respective first threaded fastener and the second threaded fastener so that the first threaded fastener fills the first through hole and the second threaded fastener fills the second through hole.

3. The data storage device of claim 1, wherein the third seal is arranged in a non-contacting relation to the fourth seal so that an intervening gap is provided therebetween.

4. The data storage device of claim 1, wherein the third seal and the fourth seal form respective portions of a unitary seal that extends across both the first seal and the second seal.

5. The data storage device of claim 4, wherein the unitary seal nominally covers an entirety of a top surface of the selected one of the cover or the base.

6. The data storage device of claim 4, wherein the unitary seal has no intervening apertures extending therethrough.

7. The data storage device of claim 1, wherein the first seal and the second seal each comprise a first layer of adhesive with a first adhesive strength, and wherein the third seal and the fourth seal each comprise a second layer of adhesive with a second adhesive strength greater than the first adhesive strength.

8. The data storage device of claim 1, wherein the housing is hermetically sealed to retain a low density atmosphere having a density lower than air.

9. The data storage device of claim 8, wherein the low density atmosphere is a helium atmosphere.

10. The data storage device of claim 1, wherein the selected one of the cover or the base comprises a first recessed region surrounding the first through hole aperture on a top surface opposite the interior sealed environment and into which the first seal is disposed, and a second recessed region surrounding the second through hole aperture on the top surface into which the second seal is disposed, the first and second seals having a thickness nominally equal to a depth of the respective first recessed region and the second recessed region so that the respective first and second portions of the selected one of the cover or base are nominally aligned with respective top surfaces of the first and second seals.

11. The data storage device of claim 10, wherein the selected one of the cover or the base further comprises a third recessed region that surrounds the first recessed region and into which the third seal is disposed and a fourth recessed region that surrounds the second recessed region and into which the fourth seal is disposed so that a remaining portion of a top surface of the selected one of the cover or base opposite the interior sealed environment is nominally aligned with respective top surfaces of the third and fourth seals.

12. The data storage device of claim 1, wherein each of the first, second, third and fourth seals comprise a layer of adhesive and at least one metal layer.

13. The data storage device of claim 1, characterized as a hard disc drive (HDD).

14. A data storage device comprising:

a hermetically sealed housing comprising a base deck and a top cover which matingly engage to form an interior sealed environment retaining a low density atmosphere having a density less than air;

a disc stack disposed within the hermetically sealed housing comprising at least one magnetic recording disc configured for rotation about a first stationary shaft;

a first threaded fastener which extends through a first through hole aperture in the top cover to engage the first stationary shaft;

a first sealing member which contactingly engages a top surface of the top cover opposite the interior sealed environment to span and seal the first through hole aperture and a head portion of the first threaded fastener;

a second sealing member which contactingly engages an entirety of a top surface of the first sealing member and a first portion of the top surface of the top cover;

a rotary actuator disposed within the hermetically sealed housing comprising at least one data transducer configured to write data to the at least one magnetic recording disc, the rotary actuator rotatable about a second stationary shaft;

a second threaded fastener which extends through a second through hole aperture in the top cover to engage the second stationary shaft;

a third sealing member which contactingly engages the top surface of the top cover to span and seal the second through hole aperture and a head portion of the second threaded fastener, the third sealing member arranged in a spaced-apart, non-contacting relation to the first sealing member to form an intervening gap between the first sealing member and the third sealing member along the top cover; and a fourth sealing member which contactingly engages an entirety of a top surface of the third sealing member and a second portion of the top surface of the top cover.

15. The data storage device of claim 14, wherein the second sealing member is in a spaced-apart, non-contacting relation to the fourth sealing member to form an intervening gap between the second sealing member and the fourth sealing member along the top cover.

16. The data storage device of claim 14, wherein the second sealing member and the fourth sealing member form respective portions of a unitary seal that extends across both the first sealing member and the third sealing member.

17. The data storage device of claim 16, wherein the unitary seal nominally covers an entirety of the top surface of the top cover.

18. The data storage device of claim 14, wherein the first sealing member and the third sealing member each comprise a first layer of adhesive with a first adhesive strength, and wherein the second sealing member and the fourth sealing member each comprise a second layer of adhesive with a second adhesive strength greater than the first adhesive strength.

19. The data storage device of claim 14, wherein the low density atmosphere is a helium atmosphere.

20. The data storage device of claim 14, wherein each of the first, second, third and fourth seals comprise a layer of adhesive and at least one metal layer.

* * * * *